(12) United States Patent
Baur et al.

(10) Patent No.: US 6,188,019 B1
(45) Date of Patent: Feb. 13, 2001

(54) PLASTIC HOUSING FOR RECEIVING AN ELECTRICAL PRINTED CIRCUIT BOARD

(75) Inventors: Richard Baur, Pfaffenholen; Günter Fendt, Schrobenhausen, both of (DE)

(73) Assignee: Temic Telefunken microelectronic GmbH, Heilbronn (DE)

( * ) Notice: Under 35 U.S.C. 154(b), the term of this patent shall be extended for 0 days.

(21) Appl. No.: 09/143,655

(22) Filed: Aug. 31, 1998

(30) Foreign Application Priority Data

Sep. 26, 1997 (DE) .............................................. 197 42 458

(51) Int. Cl.⁷ ...................................................... H05K 5/02
(52) U.S. Cl. ............................. 174/51; 361/752; 361/753
(58) Field of Search .................................. 174/51, 35 R, 174/52.1; 361/753, 816, 818, 799, 800, 752; 439/96, 97

(56) References Cited

U.S. PATENT DOCUMENTS

| | | | |
|---|---|---|---|
| 5,053,923 | * 10/1991 | Niemetz | 361/709 |
| 5,286,920 | 2/1994 | Fassel et al. | 174/51 |
| 5,644,474 | 7/1997 | Jang | 361/753 |
| 5,872,332 | * 2/1999 | Verma | 174/35 C |

FOREIGN PATENT DOCUMENTS

| | | |
|---|---|---|
| 9114287 | 4/1993 | (DE) . |
| 9007621 | 5/1993 | (DE) . |
| 4329083A1 | 3/1995 | (DE) . |
| 4330977C2 | 3/1995 | (DE) . |
| 297 09 904 U 1 | 9/1997 | (DE) . |
| 2 269 946 | 2/1994 | (GB) . |

* cited by examiner

Primary Examiner—Kristine Kincaid
Assistant Examiner—Hung V Ngo
(74) Attorney, Agent, or Firm—Venable; Norman N. Kunitz

(57) ABSTRACT

As, with plastic housings, there is no direct electrical connection between the housing and a metal carrier body, an electrical connection has been made initially to a plug device in the plastic housing in extremely complex fashion, electrical connection to chassis ground being provided outside the plastic housing via a lead to the carrier body. With plastic housings metal inserts are used for mechanically fixing the mounting flange. According to the present invention said inserts can also be electrically connected to an electrical printed circuit board terminal very simply by means of an electrically conducting connecting device.

5 Claims, 2 Drawing Sheets

State of Art

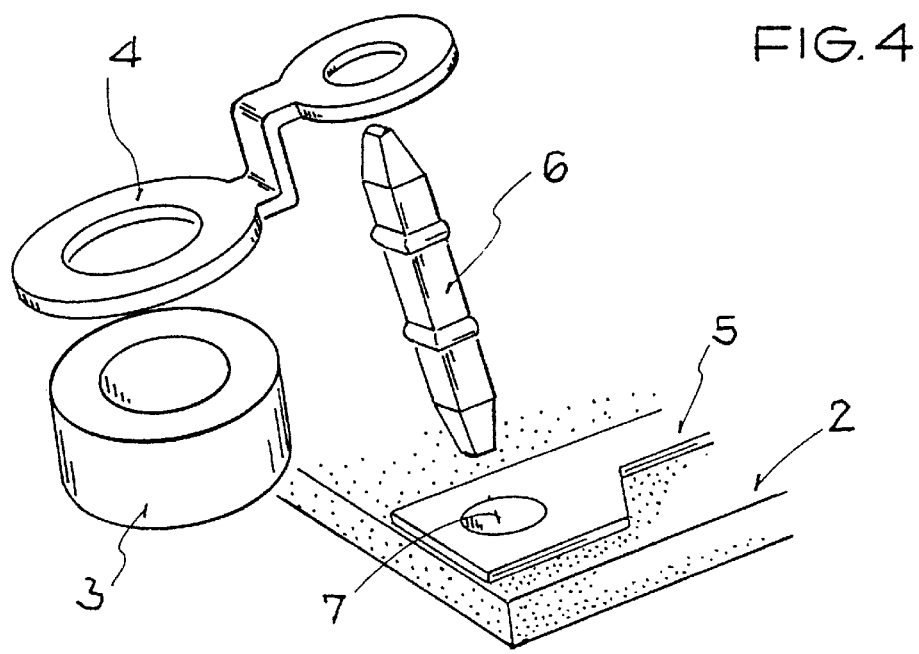
FIG. 4
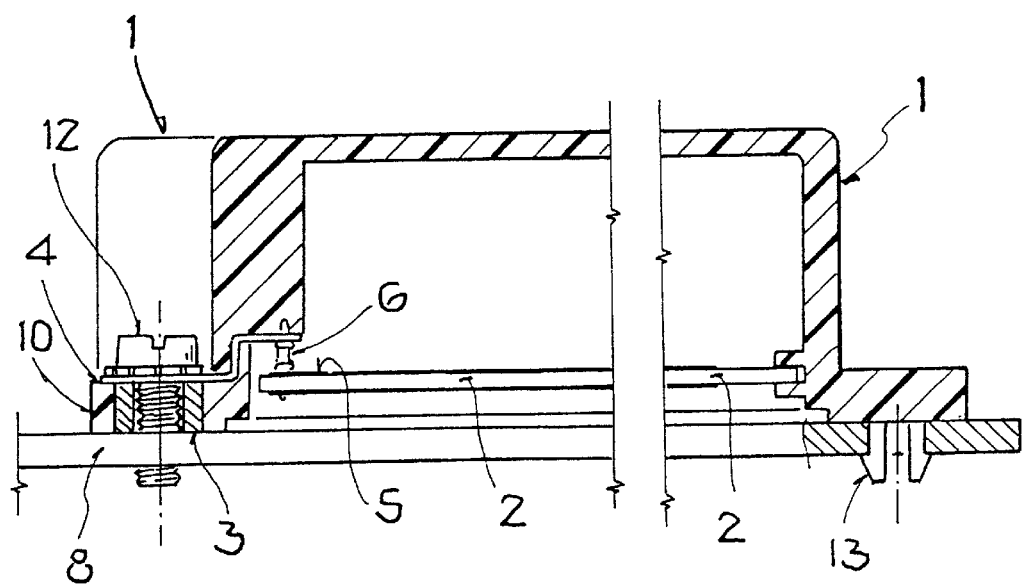
FIG. 5
FIG. 6

PLASTIC HOUSING FOR RECEIVING AN ELECTRICAL PRINTED CIRCUIT BOARD

BACKGROUND OF THE INVENTION

The invention relates to a plastic housing for receiving an electrical printed circuit board according to the preamble of patent claim 1 and a procedure for mounting an electronic subassembly on a carrier body according to patent claim 5.

Increasingly, electronic subassemblies are being made with plastic housings, especially in the automotive industry, since these are considerably lighter, in particular, as well as being relatively easy and cheap to manufacture, which in turn reduces fuel consumption. To attach the plastic housing to a metal carrier body, the plastic housing generally includes a mounting flange with an opening. However, as the plastic housing is very susceptible to damage in the area of the opening as a result of the forces arising during the mounting operation as when tightening screws or riveting, a hole-strengthening metal insert is employed, as can be seen, for example, from German patent DE 90 07 621 U1 (hollow rivet 4 in FIG. 1).

However, plastic housings have the disadvantage of not being able to provide electrical connection to a metal carrier body, as is used in the automotive industry, in particular, for connecting to chassis ground. A purely friction-grip connection, provided, for example, by screwing the printed circuit board to the metal housing carrier body, does not satisfy the safety requirements of the automotive industry, as the printed circuit board cannot be totally enclosed by the plastic housing and also because a friction-grip connection such as this cannot guarantee electrical contact over the service life of the product. More particularly, the printed circuit board displays a tendency to warp slightly over time in the area of the friction-grip connection and the large contact surface required for providing electrical contact eventually disappears. Cables passed through and welded inside the plastic housing, as can be seen from German patent DE 43 30 977 C2, for example, are extremely susceptible to breakage.

For this reason, electrical wiring to the chassis is currently guided through a plug construction in the plastic housing together with the other wiring for the printed circuit board and from there connected at the screw fastening point to the metal carrier body, and thus to chassis ground, during mounting by means of a cable clamp or similar device. A plastic housing of this type with a state-of-the-art connection to chassis ground via a plug device is shown at FIG. 2. Housing 1 contains printed circuit board 2, which has an electrical connection 14 to plug device 15. In plug device 15 a grounding pin not further explained is connected to a lead 11 outside plastic housing 1 and led to flange 10 and mechanical connecting means 12 (shown as a screw). However, the cost of having a separate grounding pin such as this in the plug device, in particular the cost of the parts, and of the mounting operation, including that for lead 11 outside housing 1, is considerable. German patent DE 297 09 904 U1 describes a solution similar to this. Additional contact springs for grounding purposes are described in German patent DE 91 14 287 U1.

SUMMARY OF THE INVENTION

A plastic housing for making a simple electrical connection between a printed circuit board and a metal carrier body is disclosed.

The basic idea is to employ the metal insert, hitherto used solely for mechanically stabilizing the mounting flange, as an electrical conductor and to connect it electrically with an electrical terminal on the printed circuit board. The economic benefits gained by the saving in plug device cost can be of decisive market importance. Particularly advantageously, the necessary electrical connection between the metal insert and the electrical printed circuit board terminal can be realized by running an electrical lead such as a metal or wire element bent according to the shape of the plastic housing within the plastic housing material from the printed circuit board terminal to the metal insert. An electrical connecting device such as this is, for example, co-molded directly with the plastic material during manufacture of the plastic housing. It may also be joined to the metal insert or be an inherent part of it.

Equally advantageous is the second method of providing electrical connection to the printed circuit board terminal by way of an electrically conducting layer on the surface of the plastic housing, preferably on the inner side. As is commonly known, deposition of a corresponding metallization path is very easy to accomplish.

Generally speaking, electrical connection between the metal insert and the printed circuit board can also be made by means of a metal part inside the plastic housing such as a screening plate or a metal part of the inherently plastic housing.

In describes a preferred development of the invention the electrical lead is run along the inside surface of the plastic housing to a metal interference-fit pin that on assembly is pressed into an at least partially metallized opening in the plastic housing on the one hand and into an opening located in the electrical printed circuit board terminal on the other and retained on both sides.

In a procedure for mounting an electrical subassembly having a metal insert in the mounting flange, an additional snap-in means being provided on the underside of the plastic housing and an associated snap-in opening on the carrier body, by means of which the subassembly is initially locked in place and then aligned by rotating the subassembly with respect to the snap-in connection so that the metal insert in the subassembly housing mounting flange comes to rest over a second opening in the carrier body, where the subassembly is retained by a mechanical connecting means such as a screw or a rivet. It is particularly advantageous to determine by testing the conductivity of the electrical connection between printed circuit board and metal carrier body whether the mounting operation has been successfully completed and a corresponding electrical connection made. The process monitoring of the chassis ground is of particular importance, especially for safety-relevant subassemblies, as in the automotive industry, for example.

DESCRIPTION OF THE PREFERRED EMBODIMENTS

Figure 2:
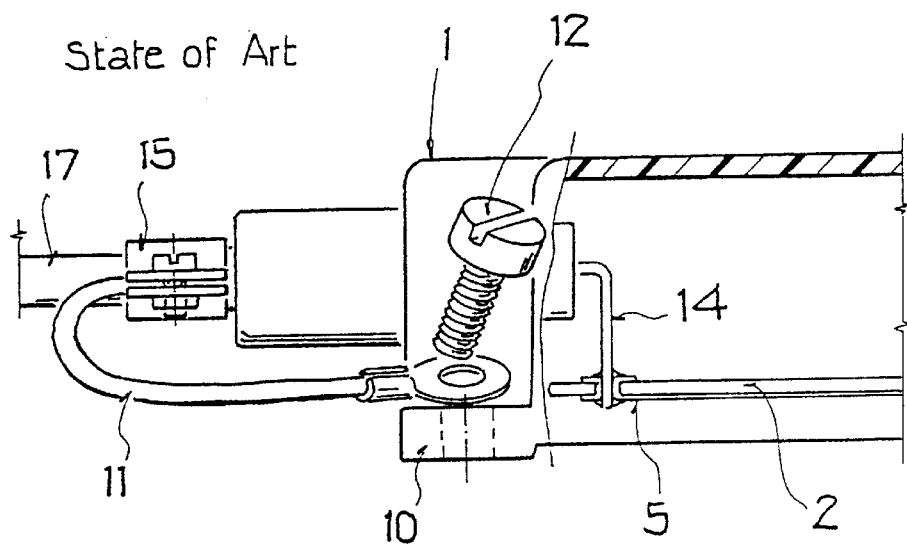
Figure 3:
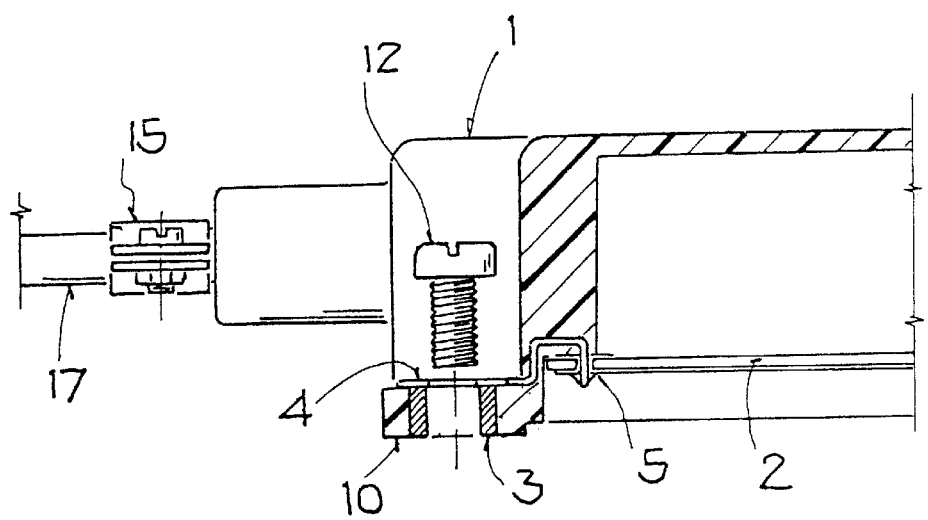
Figure 1:
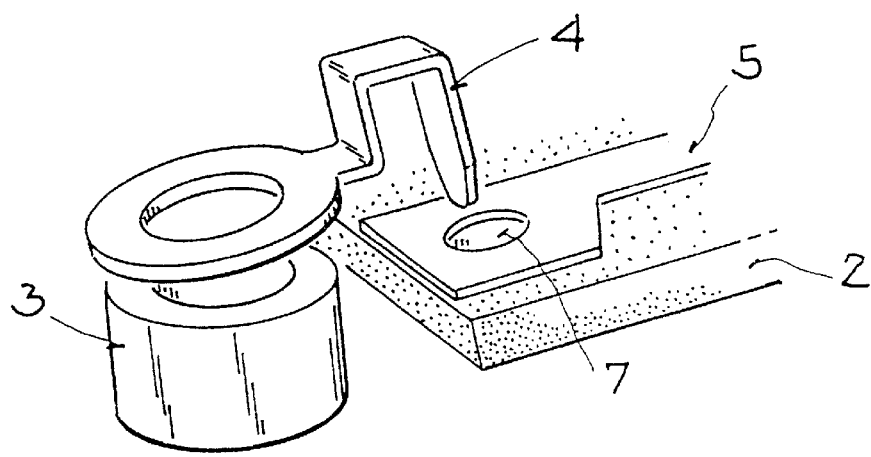
FIG. 1 Electrically conducting connecting device that provides electrical connection between the metal insert in the mounting flange and the printed circuit board connection zone and is molded or inserted in the plastic housing FIG. 2 State-of-the-art plastic housing having a lead to the mounting flange outside the housing FIG. 3 Plastic housing with the electrically conducting connecting device between the metal insert in the mounting flange and the connection zone of the printed circuit board FIG. 4 Interference-fit pin between the connecting device and the connection zone of the printed circuit board FIG. 5 Sectional view of a mounted plastic housing, having an interference-fit pin between the connecting device and the connection zone of the printed circuit board FIG. 6 Snap-in means on the underside of the housing

FIG. 1 is a detailed drawing of an electrically conducting connecting device 4 providing electrical connection between metal insert 3 in mounting flange 10 and connection zone 5 of printed circuit board 2. Metal insert 3 and connection zone 5 of printed circuit board 2 are depicted in sketch form in FIG. 1. In this example electrical connecting device 4 is fashioned from a metal sheet; it can, however, be accomplished by an appropriately bent wire construction. Feasibly, electrically conducting connecting device 4 can be permanently joined to metal insert 3 or they can be fashioned from one part. Electrically conducting connecting device 4 is formed according to the shape of the plastic housing and the location of connection zone 5 and metal insert 3 in mounting flange 10. Electrically conducting connecting device 4 is molded or inserted in the plastic housing material, as shown in FIG. 3. Electrically conducting connecting device 4 is pressed or soldered into connection zone 5 of printed circuit board 2, although with an interference fit it may be possible to dispense with soldering insofar as connection zone 5 is accordingly metallized also on the inner side of opening 7. FIG. 2 shows the state of the art.

FIG. 3 shows a plastic housing 1 having electrically conducting connecting device 4 between metal insert 3 in mounting flange 10 and connection zone 5 of printed circuit board 2. Therefore, connection to chassis ground is not made with connecting lead 17 via plug device 15, but rather directly from connection zone 5 of printed circuit board 2 by way of electrically conducting connecting device 4 and metal insert 3 to a metal carrier body not further shown in FIG. 3, which itself is connected to electrical ground.

Here, however, connecting means 12 may also assume an electrical connecting function, should it be of electrically conducting material.

FIG. 4 depicts an interference-fit pin 6 between electrically conducting connecting device 4 and connection zone 5 of printed circuit board 2, the latter and metal insert 3 again being shown in sketch form. Here, the dimensions of opening 7 in connection zone 5 of printed circuit board 2 ensure that interference-fit pin 6 is pressed in and rigidly retained during assembly.

As at FIG. 3, FIG. 5 shows a sectional view of a mounted plastic housing 1, an interference-fit pin 6 according to FIG. 4 being provided in this example between connecting device 4 and connection zone 5 of printed circuit board 2. FIG. 5 depicts the mechanical connection of a mechanical connecting means (screw) 12 to metal carrier body 8. The embodiment featuring the twin-sided interference-fit pin 6, in particular, is also suitable for establishing electrical connection to a metal component that forms a constituent part of the housing such as a screening plate. It may also be used for housings containing metal parts or for all-metal housings, it then being possible to dispense with a further metal connecting device if there is direct connection with metal insert 3.

FIG. 6 is a detailed drawing of the snap-in means 13 on the underside of the housing by means of which plastic housing 1 is additionally secured on carrier body 8.

What is claimed is:

1. A plastic housing receiving an electrical printed circuit board comprising a mounting flange having an opening and a metal insert in the mounting flange, so that the plastic housing is fixed to a metal carrier body at the mounting flange by a mechanical connecting means and the housing further comprising electrical connecting means for electrically connecting an electrical printed circuit board terminal to the metal insert and in turn to the metal carrier body via said insert, wherein the circuit board is located generally inside the housing and the metal insert is located generally outside the housing, and the electrical connecting means comprises a connecting piece separate from the circuit board connected mechanically and electrically to the metal insert, and wherein the housing comprises plastic material injection molded around the connecting piece and the connecting piece comprises a projecting portion that projects through the housing to the metal insert, and the connecting piece further comprises a contact pin that electrically contacts the circuit board.

2. A plastic housing as claimed at claim 1, wherein the projecting portion is separate from the contact pin.

3. A plastic housing as claimed at claim 2, wherein the contact pin is a metal interference-fit pin and the connecting means comprises an electrical lead within the plastic housing electrically connected to the metal interference-fit pin, and wherein the metal interference-fit pin is pressed through an opening located in the electrical printed circuit board terminal and thus retained and electrically connected.

4. A plastic housing as claimed at claim 1, wherein the connecting means comprises a metal component in the plastic housing.

5. A plastic housing as claimed at claim 1, wherein the connecting means comprises an electrically conducting layer on a surface of the plastic housing.

* * * * *